United States Patent
Kitada et al.

(10) Patent No.: US 8,968,538 B2
(45) Date of Patent: Mar. 3, 2015

(54) SPUTTERING DEVICE AND SPUTTERING METHOD

(75) Inventors: Toru Kitada, Cupertino, CA (US); Naoki Watanabe, Kawasaki (JP); Motonobu Nagai, Tokyo (JP); Masahiro Suenaga, Tokyo (JP); Takeo Konno, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 648 days.

(21) Appl. No.: 13/121,338

(22) PCT Filed: Sep. 29, 2009

(86) PCT No.: PCT/JP2009/004973
§ 371 (c)(1),
(2), (4) Date: May 31, 2011

(87) PCT Pub. No.: WO2010/038421
PCT Pub. Date: Apr. 8, 2010

(65) Prior Publication Data
US 2011/0223346 A1    Sep. 15, 2011

(30) Foreign Application Priority Data

Sep. 30, 2008  (JP) .................................. 2008-252858

(51) Int. Cl.
*C23C 14/00* (2006.01)
*C25B 9/00* (2006.01)
(Continued)

(52) U.S. Cl.
CPC ........... *C23C 14/542* (2013.01); *C23C 14/3464* (2013.01); *H01J 37/3266* (2013.01);
(Continued)

(58) Field of Classification Search
CPC ............... C23C 14/542; C23C 14/3464; H01J 37/3266; H01J 37/32733; H01J 37/3405; H01J 37/3408; H01J 37/3414
USPC ............. 204/298.16, 298.17, 298.18, 298.23, 204/298.28
See application file for complete search history.

(56) References Cited

U.S. PATENT DOCUMENTS 5,626,727 A * 5/1997 Yamanishi et al. ...... 204/192.12
6,610,180 B2 * 8/2003 Sakai et al. ............... 204/192.12
(Continued)

FOREIGN PATENT DOCUMENTS

| JP | 2000-265263 A | 9/2000 |
| JP | 2002-43159 A | 2/2002 |
| JP | 2004-232006 A | 8/2004 |

OTHER PUBLICATIONS

U.S. Appl. No. 13/104,472, filed May 10, 2011.
(Continued)

*Primary Examiner* — Michael Band
(74) *Attorney, Agent, or Firm* — Fitzpatrick, Cella, Harper & Scinto

(57) ABSTRACT

A magnetic film having excellent uniformity in in-plane distribution of film thickness or sheet resistance is formed when the film is formed by forming a magnetic field on a processing surface of a substrate (21) and performing oblique incidence sputtering by using high discharge power.
A sputtering apparatus (1) is provided with a substrate holder (22) for holding rotatably the substrate (21) in the surface direction of the processing surface of the substrate; a substrate magnetic field forming device (30) which is disposed to surround the substrate (21) and forms a magnetic field on the processing surface of the substrate (21); cathodes (41) which are arranged diagonally above the substrate (21) and are supplied with electric discharge power; a position detecting device (23) for detecting a rotation position of the substrate (21); and a control device (50) which adjusts the rotation speed of the substrate (21) in accordance with the rotation position detected by the position detecting device (23).

4 Claims, 6 Drawing Sheets

(51) Int. Cl.
*C25B 11/00* (2006.01)
*C25B 13/00* (2006.01)
*C23C 14/54* (2006.01)
*C23C 14/34* (2006.01)
*H01J 37/32* (2006.01)
*H01J 37/34* (2006.01)
*H01F 41/18* (2006.01)

(52) U.S. Cl.
CPC ....... *H01J37/32733* (2013.01); *H01J 37/3405* (2013.01); *H01J 37/3408* (2013.01); *H01J 37/3414* (2013.01); *H01F 41/18* (2013.01)
USPC ............ 204/298.28; 204/298.16; 204/298.17; 204/298.18; 204/298.23

(56) References Cited

U.S. PATENT DOCUMENTS 6,616,816 B2 * 9/2003 Sakai .................... 204/192.1
2011/0209986 A1 * 9/2011 Kitada et al. ............ 204/192.15

OTHER PUBLICATIONS

English translation of an International Preliminary Report on Patentability issued in International Application No. PCT/JP2009/004973, dated Apr. 14, 2011—6 pages.

* cited by examiner

Embodiment
1σ=0.5%

Comparative
embodiment
1σ=3.1%

SPUTTERING DEVICE AND SPUTTERING METHOD

TECHNICAL FIELD

The present invention relates to a sputtering device and a sputtering method for forming a film on a substrate by supplying cathodes with high electric discharge power to cause electric discharge between the cathodes and a substrate holder, thereby sputtering targets mounted on the cathodes. More specifically, the present invention relates to a sputtering device and a sputtering method that form a film while rotating the substrate about a rotary shaft perpendicular to the processing surface (film forming surface).

BACKGROUND ART

There is a conventionally known sputtering device that a cathode unit provided with a cathode for supporting a target is disposed offset obliquely above a substrate, and the target is sputtered by oblique incidence sputtering while rotating the substrate about a rotary shaft perpendicular to the processing surface of the substrate to form a film on the substrate.

As a related technology, there is proposed a sputtering method and device that, for example, rotate a substrate at an appropriate speed and maintain an angle θ of the center axial line of the target relative to the normal of the substrate in a relation of $15° \leq \theta \leq 45°$ (see Patent Reference 1). This sputtering device can form a film having uniform film thickness and film quality even when the target has a diameter same to or smaller than the substrate.

PRIOR ART REFERENCE

Patent Reference

[Patent Reference 1] JP-A 2000-265263

SUMMARY

Problems to be Solved by the Invention

Even if the conventional oblique incidence sputtering technology is used to form a magnetic film, a sheet resistance (or film thickness) is largely deviated in comparison with a case that another material is formed into a film. But, the formation of this magnetic film did not become a large problem because an in-plane distribution (1σ) of the sheet resistance (or film thickness distribution) having a value of less than 1% was realized.

Meanwhile, it is being attempted to increase electric discharge power to a high level in response to increasing demands for improvement of a sputtering rate in these years. Specifically, it is now being tried to increase the electric discharge power supplied to the cathode in order to increase the sputtering rate.

But, when the magnetic film was formed by oblique incidence sputtering using high electric discharge power, there was a problem that the sheet resistance or film thickness distribution or deviation was increased more, which was a nonnegligible problem.

In view of the circumstances described above, the present invention provides a sputtering device and a sputtering method capable of forming a film having excellent uniformity in an in-plane distribution of the sheet resistance (or in-plane distribution of the film thickness) when the film is formed by oblique incidence sputtering.

Means for Solving the Problem

The construction of the invention completed in order to achieve the above object is described below.

Specifically, the sputtering device according to a first aspect of the invention is provided with a substrate holder for holding a substrate rotatably about a rotary shaft perpendicular to its processing surface; a substrate magnetic field forming device disposed around the substrate and rotatable together with or in synchronization with the substrate to form a magnetic field on the processing surface of the substrate; and cathodes disposed at positions to face obliquely the substrate and supplied with electric discharge power. And, the sputtering device according to the first aspect of the invention is further provided with a position detecting device for detecting a rotation position of the substrate, and a control device for controlling a rotation speed of the substrate according to the rotation position of the substrate detected by the position detecting device.

According to the first aspect of the invention, the substrate is provided with a first portion which is generated according to a formed state of the magnetic field and to which sputtering particles are apt to be attracted, and a second portion which has a sputtering particle attracting force lower than that of the first portion. And, it is preferable that the control device adjusts the rotation speed of the substrate to a first rotation speed when the first portion of the substrate is at a position close to a cathode generating an electric discharge by supply of the electric discharge power and adjusts the rotation speed of the substrate to a second rotation speed lower than the first rotation speed when the second portion of the substrate is at a position close to the cathode generating the electric discharge.

It is preferable that the control device adjusts the rotation speed of the substrate to the first rotation speed by increasing it gradually as the first portion approaches the cathode generating the electric discharge by supply of the electric discharge power and adjusts the rotation speed of the substrate to the second rotation speed by decreasing it gradually as the second portion approaches the cathode generating the electric discharge.

The first aspect of the invention includes as a preferable embodiment that the substrate magnetic field forming device forms a one-directional magnetic field in one direction within the processing surface of the substrate, and when it is determined that a peripheral edge portion of the substrate, where a linear line extended in parallel to the direction of the one-directional magnetic field and running through the center of the substrate intersects at an N-pole side of the substrate magnetic field forming device, is an N-pole side center edge portion and a peripheral edge portion of the substrate, where the linear line intersects at an S-pole side of the substrate magnetic field forming device, is an S-pole side center edge portion, the first portion is the N-pole side center edge portion, and the second portion is the S-pole side center edge portion.

In addition, it is preferable that the control device according to the first aspect of the invention calculates the rotation speed as a sinusoidal function of a rotation angle of the substrate to control the rotation speed of the substrate. And, the first aspect of the invention includes as its preferable embodiment that multiple cathodes capable of selectively supplying the electric discharge power are disposed.

The sputtering device according to a second aspect of the invention is provided with a substrate holder for holding a substrate rotatably about a rotary shaft perpendicular to its processing surface; a substrate magnetic field forming device disposed around the substrate, rotatable together with or in synchronization with the substrate and configured of an electromagnet forming a one-directional magnetic field directed in one direction within the processing surface of the substrate; and cathodes disposed at positions to face obliquely the substrate and supplied with electric discharge power. And, the sputtering device according to the second aspect of the invention is provided with a position detecting device for detecting a rotation position of the substrate; and a control device for controlling an electric current supplied to the substrate magnetic field forming device in accordance with the rotation position of the substrate detected by the position detecting device, wherein when it is determined that a peripheral edge portion of the substrate, where a linear line extended in parallel to the direction of the one-directional magnetic field and running through the center of the substrate intersects at an N-pole side of the substrate magnetic field forming device, is an N-pole side center edge portion and a peripheral edge portion of the substrate, where the linear line intersects at an S-pole side of the substrate magnetic field forming device, is an S-pole side center edge portion, the control device adjusts the electric current supplied to the substrate magnetic field forming device to decrease gradually the magnetism of the N pole as the N-pole side center edge portion approaches a cathode generating an electric discharge by supply of the electric discharge power and to increase gradually the magnetism of the N pole as the S-pole side center edge portion approaches the cathode generating the electric discharge.

A third aspect of the invention is a sputtering method of forming a magnetic film by sputtering from a direction oblique to a processing surface of a substrate in a state that a magnetic field is formed along the processing surface of the substrate while the substrate is rotated about a rotary shaft perpendicular to the processing surface, wherein a rotation speed of the substrate is controlled on the basis of a rotation position of the substrate.

According to the third aspect of the invention, the substrate has a first portion which is generated according to a formed state of the magnetic field and to which sputtering particles are apt to be attracted, and a second portion which has a sputtering particle attracting force lower than that of the first portion. And, according to the third aspect of the invention, it is preferable to determine that the rotation speed of the substrate is a first rotation speed when the first portion of the substrate is at a position close to a cathode generating an electric discharge by supply of electric discharge power and the rotation speed of the substrate is a second rotation speed lower than the first rotation speed when the second portion of the substrate is at a position close to the cathode generating the electric discharge.

According to the third aspect of the invention, it is preferable that the rotation speed of the substrate is increased gradually to the first rotation speed as the first portion approaches the cathode generating the electric discharge by supply of the electric discharge power, and the rotation speed of the substrate is decreased gradually to the second rotation speed as the second portion approaches the cathode generating the electric discharge.

According to the third aspect of the invention, it is preferable that when it is determined that the magnetic field formed along the processing surface of the substrate is a one-directional magnetic field directed in one direction within the processing surface of the substrate, a peripheral edge portion of the substrate, where a linear line extended in parallel to the direction of the one-directional magnetic field and running through the center of the substrate intersects at an N-pole side of the substrate magnetic field forming device, is an N-pole side center edge portion and a peripheral edge portion of the substrate, where the linear line intersects at an S-pole side of the substrate magnetic field forming device, is an S-pole side center edge portion, the first portion is the N-pole side center edge portion, and the second portion is the S-pole side center edge portion.

It is also preferable that the rotation speed of the substrate is controlled by calculating the rotation speed as a sinusoidal function of a rotation angle of the substrate.

A fourth aspect of the invention is a sputtering method of forming a magnetic film by sputtering from a direction oblique to a processing surface of a substrate in a state that a one-directional magnetic field directed to one direction is formed within the processing surface of the substrate by an electromagnet while the substrate is rotated about a rotary shaft perpendicular to the processing surface. And, according to the fourth aspect of the invention, when it is determined that a peripheral edge portion of the substrate, where a linear line extended in parallel to the direction of the one-directional magnetic field and running through the center of the substrate intersects at an N-pole side of the substrate magnetic field forming device, is an N-pole side center edge portion and a peripheral edge portion of the substrate, where the linear line intersects at an S-pole side of the substrate magnetic field forming device, is an S-pole side center edge portion; an electric current supplied to the electromagnet is adjusted to decrease gradually the magnetism of the N pole as the N-pole side center edge portion approaches a cathode generating an electric discharge by supply of electric discharge power and to increase gradually the magnetism of the N pole as the S-pole side center edge portion approaches the cathode generating the electric discharge.

EFFECTS OF THE INVENTION

According to the present invention, a magnetic film excelling in uniformity of film thickness distribution or in-plane distribution of sheet resistance can be obtained even when it is formed by oblique incidence sputtering using high electric discharge power.

DETAILED DESCRIPTION OF THE INVENTION

Embodiments of the present invention are described below with reference to the drawings but the present invention is not limited to the embodiments.

Figure 1:
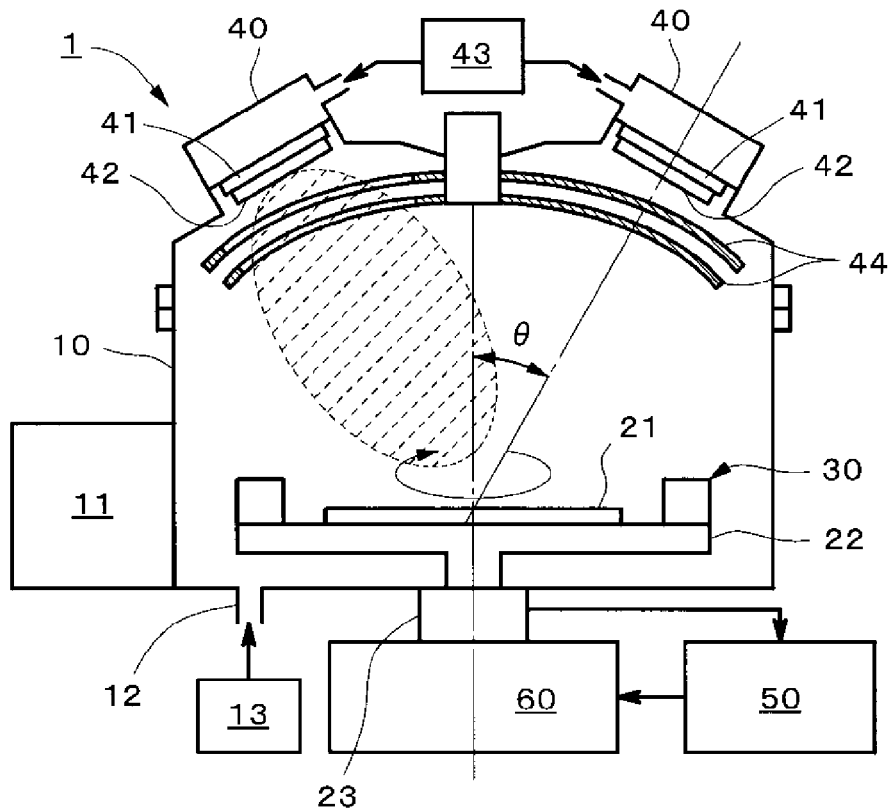
FIG. 1 is a schematic sectional view showing schematically a sputtering device according to an embodiment of the present invention.
Figure 3:
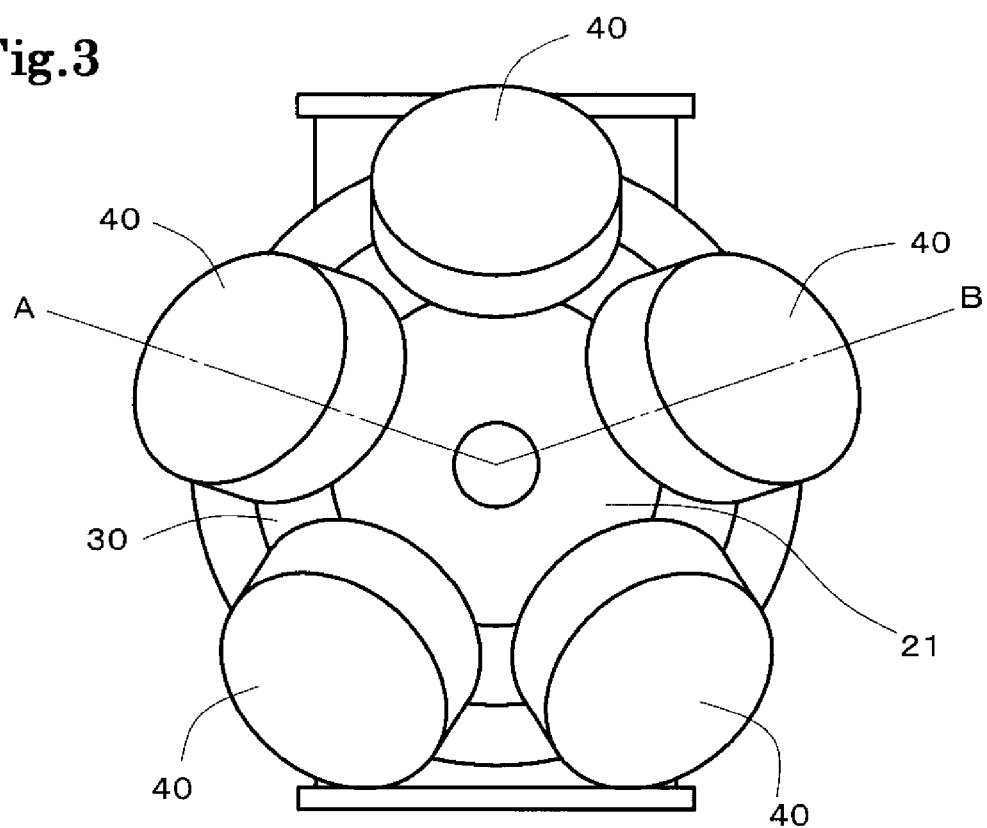
FIG. 3 is a plan view showing schematically an arrangement relationship between a substrate holder and cathode units.
Figure 4:
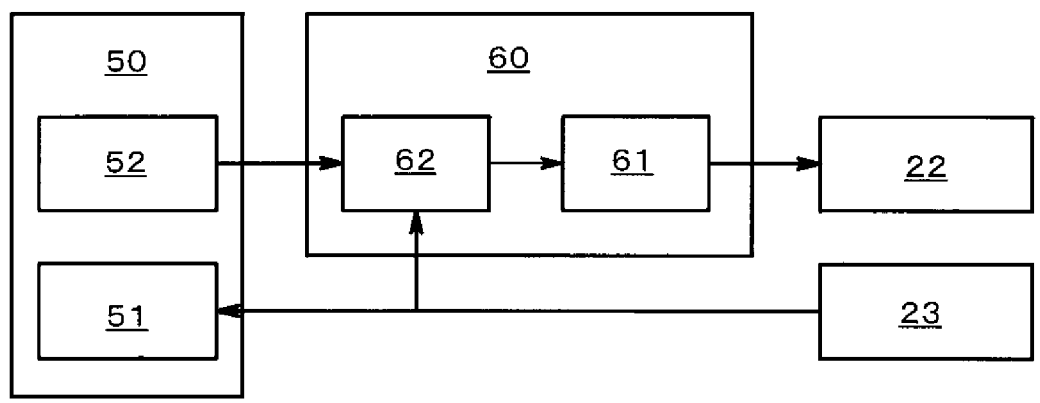
FIG. 4 is an explanatory view of a mechanism of controlling a rotation speed of the substrate holder by a control device.
Figure 5:
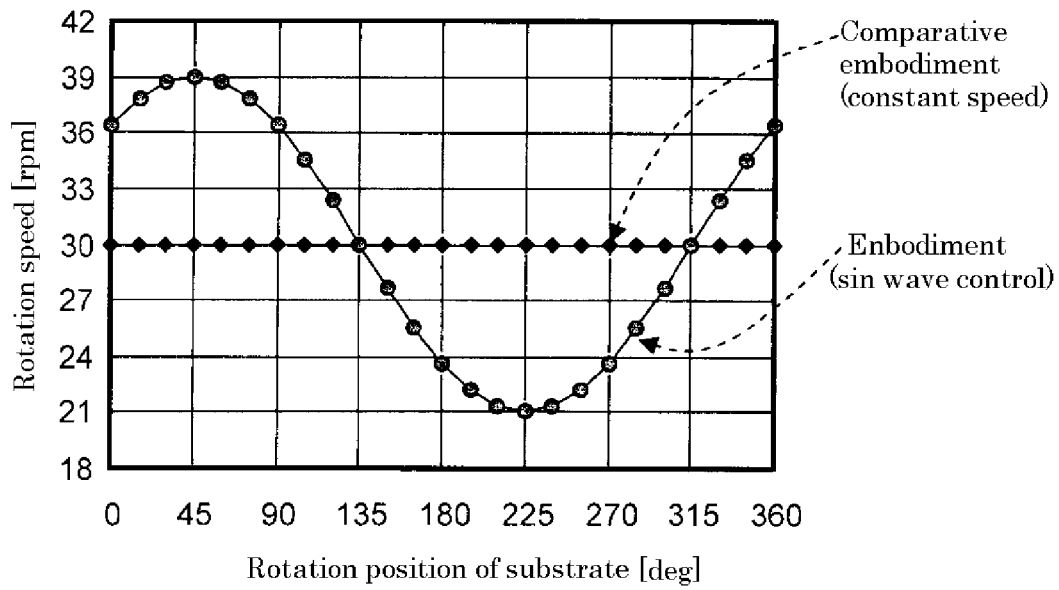
FIG. 5 is a view illustrating the principle of the present invention.

Referring to FIG. 1 to FIG. 8C, one embodiment of a sputtering device and a sputtering method according to the invention is described below. FIG. 1 corresponds to the cross section taken along line A-B of FIG. 3. In FIG. 1 and FIG. 5, the shaded portion indicated by broken lines indicates plasma schematically.

As shown in FIG. 1, a sputtering device 1 of this embodiment is provided with a chamber (reaction vessel) 10 which defines a processing space. The chamber 10 is connected with an exhaust pump 11 as an exhaust system, which can evacuate the chamber 10 to a desired degree of vacuum, via an unshown main valve such as a gate valve.

The chamber 10 is formed with a gas inlet port 12, and the gas inlet port 12 is connected with a reactive gas introducing system 13 for introducing a reactive processing gas (reactive gas) into the chamber 10. The reactive gas introducing system 13 is connected with, for example, a gas cylinder (not shown) via an automatic flow rate controller (not shown) such as a massflow controller, and the reactive gas is introduced through the gas inlet port 12 at a prescribed flow rate. The reactive gas introducing system 13 supplies the reactive gas into the chamber 10 when reactive sputtering is performed within the chamber 10.

A substrate holder 22 for supporting a disk-shaped substrate 21 on its top surface is disposed at a lower part in the processing space of the chamber 10. The substrate 21 to be processed is normally conveyed onto the substrate holder 22 through a horizontal slot (not shown) by a handling robot (not shown). The substrate holder 22 is a disk-shaped placing table and can support by attracting the substrate 21 to its top surface by electrostatic attraction for example. The substrate holder 22 is made of an electroconductive member and functions also as an electrode which causes electric discharge between the electrode and cathodes 41, 41, . . . disposed on cathode units 40, 40, . . . described later.

The substrate holder 22 is connected to a rotation drive mechanism 60 so as to be rotatable about its central axis and rotates the substrate 21, which is attracted to be supported on the mounting surface, about a rotary shaft which is perpendicular to its processing surface. And, the rotation drive mechanism 60 of the substrate holder 22 is provided with a position detecting device 23 for detecting a rotation position of the substrate 21 (a rotation position of the substrate holder 22, a rotation position of a magnetic field M formed by a substrate magnetic field forming device 30 described later). As the position detecting device 23, for example a rotary encoder can be used. In the drawing, 50 indicates a control device described later.

Figure 2:
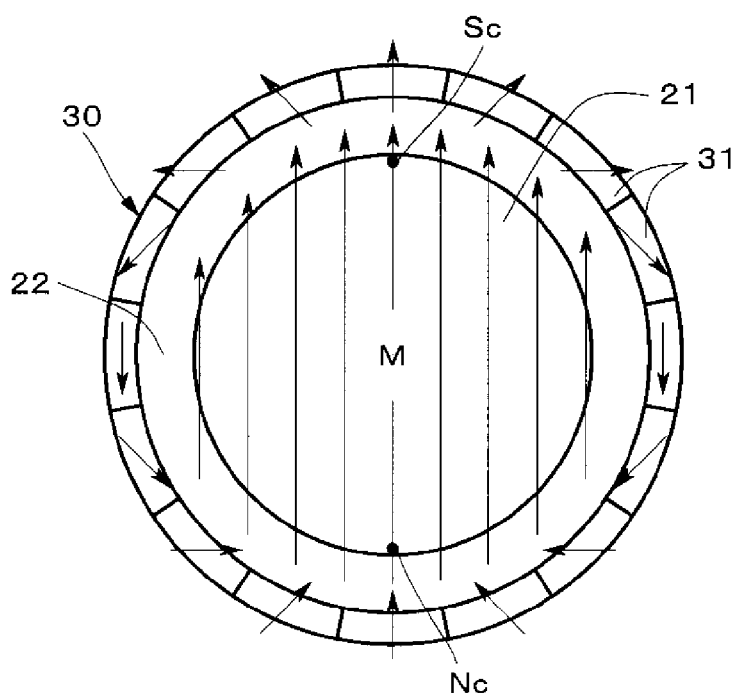
FIG. 2 is a plan view showing schematically an example of a substrate magnetic field generation means and a one-directional magnetic field formed by the substrate magnetic field generation means.

As shown in FIG. 1 and FIG. 2, the disk-shaped substrate holder 22 is determined to have an outer diameter which is larger than that of the substrate 21, and the substrate magnetic field forming device 30 is disposed around the substrate 21 which is on the substrate holder 22. The substrate magnetic field forming device 30 of this embodiment is configured of multiple magnet pieces 31 of permanent magnets which are arranged around the mounting surface of the substrate holder 22 at equal intervals along the circumferential direction of the substrate holder 22. As shown in FIG. 2, the substrate magnetic field forming device 30 forms a one-directional magnetic field M which is uniform toward one direction within the processing surface along the processing surface of the substrate 21. The substrate magnetic field forming device 30 shown in FIG. 2 is a dipole ring magnet which is constructed to form the one-directional magnetic field M by the multiple arc-shaped magnet pieces 31 which are magnetized in different directions mutually and arranged into a ring shape. The substrate magnetic field forming device 30 is disposed integral with the substrate holder 22 so as to rotate together with the substrate 21, so that the above-described one-directional magnetic field M also rotates together with the rotations of the substrate 21 (substrate holder 22). A peripheral edge portion of the substrate 21, where a linear line running through the center of the substrate 21 and extended in parallel to the direction of the one-directional magnetic field M intersects at an N-pole side of the substrate magnetic field forming device 30, is determined as an N-pole side center edge portion Nc, and a peripheral edge portion of the substrate 21, where the linear line intersects at an S-pole side of the substrate magnetic field forming device 30, is determined as an S-pole side center edge portion Sc.

The structure of the substrate magnetic field forming device 30 of the present invention is not limited to the above-described structure. The magnets configuring the substrate magnetic field forming device 30 may be not a string of the magnet pieces 31 but may be integrally formed into a ring shape. And, the substrate magnetic field forming device 30 may be disposed as another member which surrounds the circumference of the substrate holder 22 and is configured to be rotatable in synchronization with the rotations of the substrate 21 (substrate holder 22). In addition, the magnets configuring the substrate magnetic field forming device 30 are not limited to the permanent magnets but may be electromagnets.

As shown in FIG. 1, the substrate 21 is held in a horizontal state on the mounting surface of the substrate holder 22. As the substrate 21, for example, a disk-shaped silicon wafer is used, but it is not exclusively limited.

Targets 42, 42, . . . are held obliquely above the substrate holder 22, and the multiple cathode units 40, 40, . . . provided with the cathodes 41, 41, . . . to which electric discharge power is supplied are disposed. In other words, the multiple cathode units 40, 40, . . . are disposed for a single substrate holder 22 and mounted obliquely at top wall portions of the chamber 10. Therefore, the multiple cathodes 41, 41, . . . are disposed at positions obliquely opposed to the single substrate holder 22.

As shown in FIG. 1 and FIG. 3, five cathode units 40, 40, . . . are disposed at the top wall portions of the chamber 10 in this embodiment, but the number of cathode units 40, 40, . . . is not limited to five. The individual cathode units 40, 40, are disposed such that the individual cathodes 41, 41, . . . are oblique with respect to the processing surface of the substrate 21 on the substrate holder 22 and the centers of the individual cathodes 41, 41, . . . are positioned at equal intervals in the circumferential direction of a circle having at its center the rotary shaft of the substrate holder 22. Thus, the multiple cathode units 40, 40, . . . are disposed within the same chamber 10, so that a laminated body can be formed in the single chamber 10.

The substrate 21 and the targets 42, 42, . . . held by the cathodes 41 are not limited to having a particular diameter, but when the center of the substrate 21 and those of the cathodes 41, 41, . . . are arranged offset and the substrate 21 is rotated to form a film, the film can be formed uniformly even if the diameters of the targets 42, 42, . . . are smaller than that of the substrate 21.

A magnetron having multiple permanent magnets is provided on the back surface sides of the cathodes 41, 41, . . . of the individual cathode units 40, 40, . . . to form a magnetic field on the front surface sides of the targets 42, 42, . . . . For example, the magnetron may be configured such that a magnet assembly having the permanent magnets arranged vertically and horizontally on the back surface side of the cathodes 41, 41, . . . is configured to form a cusp magnetic field on the front surface sides of the targets 42, 42, . . . .

The plate-shaped targets 42, 42, . . . are attached to the front surface sides of the cathodes 41, 41, . . . of the individual cathode units 40, 40, . . . . In other words, the individual targets 42, 42, . . . are disposed on the side closer to the processing space than to the cathodes 41, 41, . . . , and the individual targets 42, 42, . . . are disposed to face obliquely downward. The material quality of the targets 42, 42, . . . is variable depending on the type of film formed on the substrate 21. In this embodiment, since the five cathode units 40, 40, . . . are disposed, for example, five types of targets 42, 42, . . . having different material quality can be attached, but the present invention is not exclusively limited to it.

The individual cathode units 40, 40, . . . are electrically connected to an unshown electric discharge power source for supplying electric discharge power to the cathodes 41, 41, . . . which are provided to the individual cathode units 40, 40, . . . . The electric discharge power may be any of high-frequency power, DC power, and a superposition of high-frequency power and DC power. And, the electric discharge power is selectively supplied to the individual cathodes 41, 41, . . . which are provided to the multiple cathode units 40, 40, . . . . But, separate electric discharge power sources may be connected to the individual cathodes 41, 41, . . . , or a switching mechanism such as a switch may be disposed as a common electric discharge power source for selectively supplying power to the individual cathodes 41, 41, . . . .

In addition, an electric discharge gas introducing system 43 for supplying a processing gas for electric discharge (electric discharge gas) to the vicinities of the individual cathodes 41, 41, . . . is connected to the individual cathode units 40, 40, . . . . As the electric discharge gas, for example, an inert gas such as Ar is used. The electric discharge power is supplied to a selected cathode 41 and the electric discharge gas is also supplied to the vicinity of the cathode 41 to cause plasma discharge between the cathode 41 and the substrate holder 21. Thus, the target 42 attached to the cathode 41 can be sputtered.

A shutter 44 capable of selectively opening or closing between the cathodes 41, 41, . . . and the substrate holder 22 is disposed in front of the individual cathode units 40, 40, . . . . The shutter 44 is selectively opened, so that a desired target 42 can be selected from the targets 42, 42, . . . held by the multiple cathodes 41, 41, . . . to perform sputtering. And, contamination by the targets 42, 42, . . . other than the target 42 being sputtered can be prevented from occurring.

Similar to a general same type of device, the sputtering device 1 of this embodiment is provided with a control device for controlling a film formation processing operation according to a prescribed program and detected data. The control device is comprised of a general computer and various drivers and controls on/off of the electric discharge power to the cathodes 41, 41, . . . , opening/closing of the shutter 44, supplying/stopping of the electric discharge gas by the electric discharge gas introducing system 43, supplying/stopping of the reactive gas by the reactive gas introducing system 13, the operation of the exhaust pump 11, the operation of the rotation drive mechanism 60, etc.

The present invention has a feature that it is provided with the control device 50 for adjusting the rotation speed of the substrate 21 as part or independent of the control system for controlling the above-described known film formation processing operation.

Figure 6:
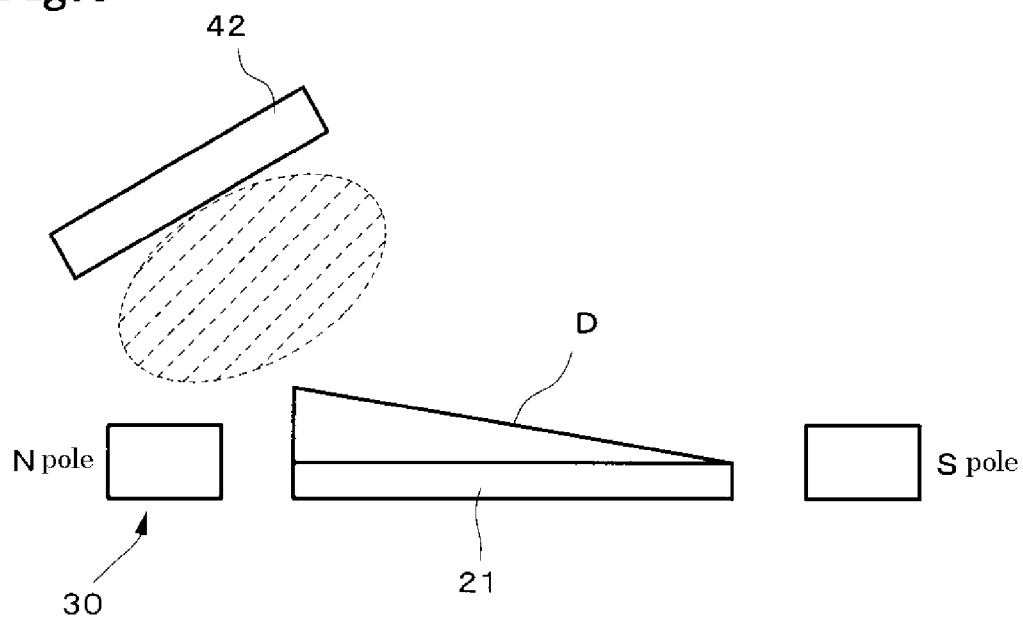
FIG. 6 is an explanatory view of a control example of the rotation speed of the substrate holder.

As shown in FIG. 4, the control device 50 adjusts the rotation speed of the substrate holder 22 (rotation speed of the substrate 21) according to the rotation position of the substrate 2 detected by the position detecting device 23. The control device 50 is provided with a targeted speed calculation unit 51 and a drive signal generation unit 52 and has a function to adjust the rotation speed of the substrate holder 22 to a predetermined speed based on the rotation position of the substrate 21. The rotation position of the substrate 21 can be detected on the basis of the position of the N-pole side center edge portion Nc or the S-pole side center edge portion Sc described with reference to FIG. 2. The targeted speed calculation unit 51 calculates a targeted rotation speed of the substrate holder 22 based on the rotation position detected by the position detecting device 23. The value of the targeted rotation speed can be calculated by previously holding, for example, a correspondence relation between the rotation position and the targeted rotation speed as a map as shown in FIG. 6. And, the drive signal generation unit 52 generates a drive signal for producing the targeted rotation speed on the basis of the targeted rotation speed calculated by the targeted speed calculation unit 51 and outputs it to the rotation drive mechanism 60.

The rotation drive mechanism 60 is provided with a feedback control portion 62 and a holder rotation drive portion 61. The drive signal generated by the drive signal generation unit 52 is sent to the feedback control portion 62 of the rotation drive mechanism 60. The position detecting device 23 of this embodiment can also detect the rotation speed of the substrate holder 22 (rotation speed of the substrate 21) in addition to the rotation position of the above-described substrate 21. The feedback control portion 62 determines the operation value of the holder rotation drive portion 61 on the basis of a deviation between the targeted rotation speed calculated by the targeted speed calculation unit 51 and the rotation speed of the substrate holder 22 outputted from the position detecting device 23. And, the driver of the holder rotation drive portion 61 which is a servo motor is controlled on the basis of the operation value to control the rotation speed of the substrate holder 22.

In this embodiment, the rotation drive mechanism 60 is provided with the holder rotation drive portion 61 and the feedback control portion 62 as described above, but the feedback control portion 62 is not essential, and the holder rotation drive portion 61 may be operated directly by the drive signal.

The action of the sputtering device 1 of this embodiment and the sputtering method performed using it are described below.

The sputtering method using the device according to the invention positions the substrate 21 to be processed on the substrate holder 22. The substrate 21 is carried onto the substrate holder 22 by, for example, a handling robot (not shown) through a horizontal slot (not shown). If necessary, a substrate bias voltage is applied from an unshown power source to the substrate holder 22.

Then, the inside of the chamber 10 is evacuated to a prescribed degree of vacuum by the exhaust system. In addition, an electric discharge gas such as Ar is introduced from the electric discharge gas introducing system 43 into the chamber

10. To perform the reactive sputtering, the reactive gas is introduced from the reactive gas introducing system 13 into the chamber 10.

For example, five types of targets 42, 42, . . . of different material components are attached to the individual cathodes 41, 41, . . . of the five cathode units 40, 40, . . . . The individual targets 42, 42, . . . have, for example, a disk shape and are formed to have the same size. As described above, the cathodes 41, 41, . . . are not limited to having a particular inclined angle in the present invention, but it is preferable that the cathode units 40, 40, . . . are disposed such that the central axes of the cathodes 41, 41, . . . relative to the normal of the processing surface of the substrate 21 have an angle θ of exceeding 0 degree and 45degrees or less. More preferably, when the angle θ is set to 5 degrees or more and 35 degrees or less, the in-plane uniformity of film thickness or sheet resistance value of the film obtained is improved.

In the above-described state, a magnetic field is first formed on the surface of the first target 42 of the first cathode unit 40, electric discharge power is supplied from an unshown electric discharge power source to the first cathode 41 to cause plasma discharge between the first cathode 41 and the substrate holder 22 to sputter the first target 42 so as to form a first layer on the substrate 21. It is preferable that the electric discharge power is determined to be 50 W or more so that a high sputtering rate can be obtained. According to the present invention, even when the high electric discharge power (e.g., 1 kW or more) is used, the in-plane distribution of film thickness or sheet resistance of the film obtained can be suppressed low, and a film with high uniformity can be obtained efficiently.

At the time of forming the film, the one-directional magnetic field M is formed on the processing surface of the substrate 21, and the substrate 21 is rotated about a rotary shaft which is perpendicular to the processing surface. In addition, while the first cathode 41 is generating the electric discharge, the position detecting device 23 detects the rotation position of the substrate 21, and the rotation speed of the substrate 21 is adjusted according to the rotation position detected by the position detecting device 23. Then, the cathode units 40, 40, . . . to which the electric discharge power is supplied are switched sequentially to perform the same film forming operation from the second cathode unit 40 to the fifth cathode unit 40.

Control of the substrate rotation speed is described below in further detail.

FIG. 5 shows a state that a magnetic material (e.g., NiFe) is formed into a film by generating the one-directional magnetic field M described with reference to FIG. 2 on the processing surface of the substrate 21 and also rotating the substrate 21 (substrate holder 22) at a prescribed speed regardless of the rotation position of the substrate 21. In this state, the film thickness becomes large at a particular portion, which is highly correlated with the one-directional magnetic field M, on the processing surface of the substrate 21. Specifically, the film thickness becomes large on the side of the N-pole side center edge portion Nc described with reference to FIG. 2, the film thickness becomes small on the side of the S-pole side center edge portion Sc, and the film thickness becomes large between the vicinity of the N-pole side center edge portion Nc and the vicinity of the S-pole side center edge portion Sc. In a case where the magnetic field is not formed within the processing surface of the substrate 21, the deposition amount of sputtering particles is large at a position close to the target 42 but small when the position is away from the target 42. It is considered that when the magnetic field is formed within the processing surface of the substrate 21, the basic distribution does not change, but a first portion to which the sputtering particles are apt to be attracted and a second portion which has the sputtering particle attracting force lower than that of the first portion are produced within the processing surface of the substrate 21 depending on the state of the magnetic field formed within the processing surface of the substrate 21.

When the magnetic field formed on the processing surface of the substrate 21 is not the one-directional magnetic field M, it is different which portions become the first portion and the second portion depending on the positional relationship between the cathodes 41 and the substrate holder 22 and the rotation speed of the substrate holder 22, and when the magnetron sputtering is performed, it is also different depending on the structure of magnets and the like disposed on the cathode 41 side. Therefore, it is preferable that a preliminary experiment is performed to determine the first portion and the second portion in advance, and the rotation speed control is performed accordingly. The preliminary experiment to determine the first portion and the second portion can be performed by forming the film with the rotation speed of the substrate holder 22 held constant and measuring the thickness distribution of the obtained film.

The control device 50 according to the present invention adjusts the rotation speed of the substrate 21 (substrate holder 22) to a first rotation speed when the first portion of the substrate 21, which is formed according to the state of the magnetic field generated on the processing surface of the substrate 21 and to which the sputtering particles are apt to be attracted, is at a position close to the cathode 41 (target 42) generating an electric discharge by supply of electric discharge power. And, when the second portion of the substrate 21 having the sputtering particle attracting force lower than that of the first portion is at a position close to the cathode 41 (target 42) generating the electric discharge, the control device 50 adjusts the rotation speed of the substrate 21 (substrate holder 22) to a second rotation speed which is slower than the first rotation speed. By controlling in this way, a deviation of film thickness can be cancelled mutually. Normally, the first rotation speed is maximum, and the second rotation speed is minimum.

In a case where the one-directional magnetic field M is formed on the processing surface of the substrate 21, the first portion is near the N-pole side center edge portion Nc, and the second portion is near the S-pole side center edge portion Sc. In this case, the control device 50 adjusts the rotation speed of the substrate 21 (substrate holder 22) to the first rotation speed when the N-pole side center edge portion Nc is at a position close to the cathode 41 (target 42) generating an electric discharge by supply of the electric discharge power. And, when the S-pole side center edge portion Sc is at a position close to the cathode 41 (target 42) generating the electric discharge, the control device 50 adjusts the rotation speed of the substrate 21 (substrate holder 22) to the second rotation speed lower than the first rotation speed.

Under control by the control device 50, the substrate 21 (substrate holder 22) is repeatedly changed from the first rotation speed to the second rotation speed and from the second rotation speed to the first rotation speed. The change from the first rotation speed to the second rotation speed or the change from the second rotation speed to the first rotation speed may be performed stepwisely in stages of two or more, but it is preferable to change continuously in order to facilitate the suppression of the film thickness or sheet resistance distribution of the film to be obtained. And, the rotation speed may be changed at a fixed ratio, but it is more preferable to control by calculating the rotation speed as a sinusoidal function of the rotation position (rotation angle) of the substrate 21 (substrate holder 22).

More specifically, it is preferable to control the rotation speed according to the present invention such that a rotation speed y of the substrate 21 becomes a sine wave with respect to a rotation position (rotation angle) θ of the substrate 21 as shown in FIG. 6 and the following expression (1).

$$y = A \cdot \sin(\theta + \alpha) + B \qquad (1)$$

$$A = a \cdot B \qquad (2)$$

Specifically, the control device 50 calculates the rotation speed of the substrate holder 22 (rotation speed of the substrate 21) as a sinusoidal function of the rotation angle of the substrate 21 on the basis of the above expression (1). In the expression, θ is not smaller than zero and not larger than 360 degrees (0°≤θ≤360°), A is an amplitude of the rotation speed, α is a phase angle, B is a center value of the amplitude of the rotation speed, and a is a degree of variability of the rotation speed.

In the above expression (1), the amplitude A can be set to any value in a range that a uniform film can be realized. For example, it can be decided according to the value of the center value B as shown in the expression (2), and in this case, the degree of variability a is preferably determined to be a value ranging from 0.1 to 0.4. If it is excessively small, it is difficult to obtain the effect of the present invention, and if it is excessively large, it exceeds a level that cancels the deviation when the speed is not changed, and uniformity tends to become poor. It is preferably determined that B is more than 0 rpm and not more than 100 rpm.

Figure 7A:
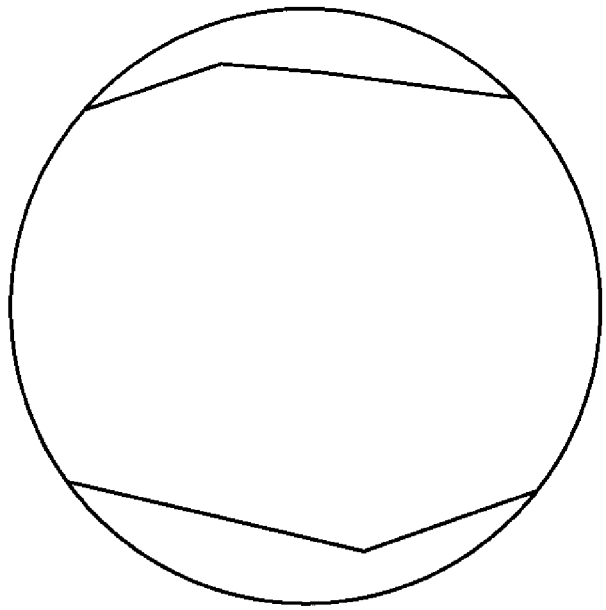
FIG. 7A and FIG. 7B are explanatory views of sheet resistance distributions of the film formed on the substrate.
Figure 7B:
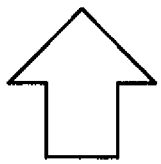
Figure 7B:
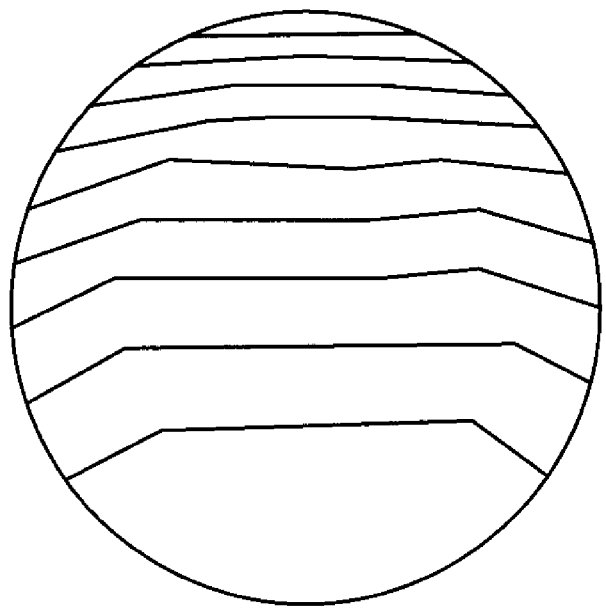

FIG. 7A and FIG. 7B show the sheet resistance distributions of the formed films as contours. The contour is a standardized sheet resistance value, and its interval is 0.01. The sheet resistance value is a value substantially proportional to a reciprocal number of the film thickness. A standardized sheet resistance value Rn is expressed by the following expression (3). In the expression (3), Rs is a sheet resistance value, and Rs,max is the maximum value of the sheet resistance value.

$$Rn = Rs/Rs, \max \qquad (3)$$

FIG. 7A shows a sheet resistance distribution of the film formed by performing the sine wave control of the rotation speed of the substrate 21 (embodiment), and FIG. 7B shows a sheet resistance distribution of the film formed with the rotation speed during the film formation held constant (comparative embodiment). The film forming conditions of the embodiment include that the material for the target 42 is NiFe, the electric discharge power is 4 kW, the film forming pressure is 0.05 Pa, the amplitude A of the rotation speed of the substrate 21 has the degree of variability a of 14%, and the center value B of the amplitude is 30 rpm. The comparative embodiment has the rotation speed of the substrate 21 fixed to 30 rpm, and the other conditions are same as those of the embodiment.

As shown in FIG. 7A and FIG. 7B, the in-plane distribution (1σ) of sheet resistance was 0.5% in the embodiment, but it was 3.1% in the comparative embodiment. Thus, it was confirmed that the uniformity of in-plane distribution in the embodiment was very excellent. In FIG. 7B, the direction of the magnetic field M described with reference to FIG. 2 is a direction substantially perpendicular to the contour, and the sheet resistance is small on the N-pole side (namely, the film thickness is large), and the sheet resistance value is large on the S-pole side (namely, the film thickness is small). In FIG. 7A, the direction of the magnetic field M is also a direction substantially perpendicular to the contour, but the sheet resistance distribution is suppressed significantly in comparison with FIG. 7B.

The rotation speed control of the substrate 21 of this embodiment is not limited to the sine wave control, and a direct function, a quadratic function and the like of the rotation position may be composed. And, the same sine wave control may be performed during the film formation, but the rotation speed control method may be changed in, for example, the first, middle and late periods. And, a third portion may be determined other than the first portion and the second portion to set to a rotation speed different from those of the first portion and the second portion.

As an example of the electronic part suitably produced by the present invention, there is a TMR (Tunneling Magneto Resistance) element.

Figure 8A:
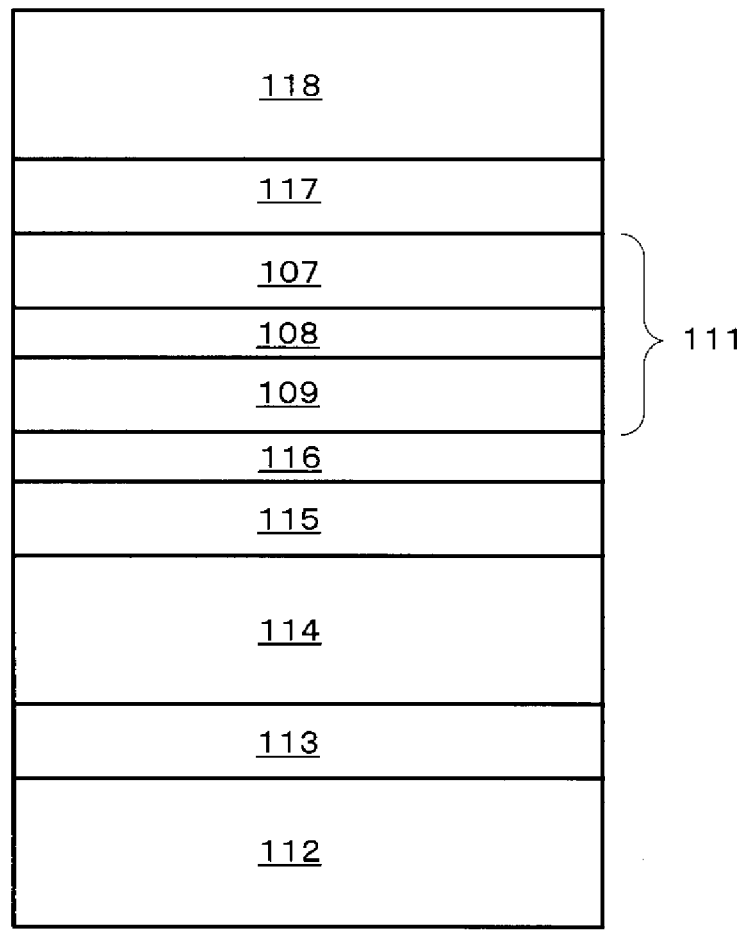
FIG. 8A, FIG. 8B and FIG. 8C are explanatory views showing a TMR element as an example of an electronic part which can be produced by applying the present invention.
Figure 8B:
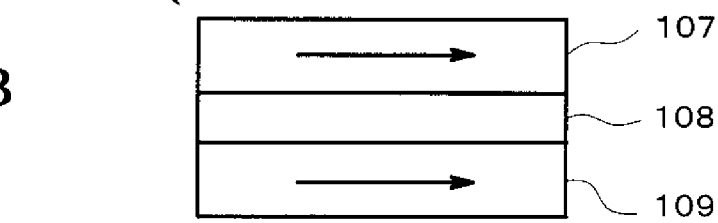
Figure 8C:
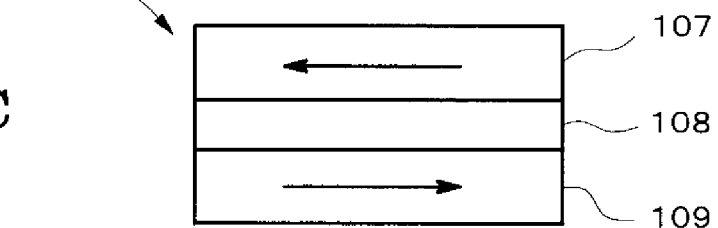

As shown in FIG. 8A to FIG. 8C, a basic layer structure of a TMR element includes a magnetic tunnel junction portion (MTJ portion) 111 which comprises a second magnetization fixing layer 107, a tunnel barrier layer 108 and a magnetization free layer 109. For example, the second magnetization fixing layer 107 is made of a ferromagnetic material, the tunnel barrier layer 108 is made of a metal oxide (such as magnesium oxide or alumina) insulating material, and the magnetization free layer 109 is made of a ferromagnetic material. In FIG. 8A, 112 denotes a lower electrode layer, 113 denotes a buffer layer, 114 denotes an antiferromagnetic layer, 115 denotes a first magnetization fixing layer, 116 denotes a nonmagnetic layer for switched connection, 117 denotes a protective layer, and 118 denotes an upper electrode layer.

As shown in FIG. 8B, the TMR element has minimum electric resistance when the second magnetization fixing layer 107 and the magnetization free layer 109 which are ferromagnetic layers positioned at both sides of the tunnel barrier layer 108 have the same and mutually parallel magnetization directions (called a "parallel state") by applying an external magnetic field when they are in a state with a constant electric current passed by applying a prescribed voltage to between them. As shown in FIG. 8C, the TMR element has a feature that its electric resistance becomes maximum when the magnetization directions of the above ferromagnetic layers are parallel and opposite (called an "antiparallel state"). Between the ferromagnetic layers at both sides of the tunnel barrier layer 108, the second magnetization fixing layer 107 is formed to fix magnetization, and the magnetization free layer 109 is formed to have a state that the magnetization direction is reversible by applying an external magnetic field for writing.

For magnetization in a prescribed direction in the film forming process of the second magnetization fixing layer 107, the substrate magnetic field forming device 30 is used to perform sputtering film formation. At this time, it is possible to form the second magnetization fixing layer 107 having uniform film thickness distribution or sheet resistance distribution by controlling to have the rotation speed as a sine wave according to the rotation position of the substrate 21 during the film formation. As a material forming the second magnetization fixing layer 107, ferromagnetic materials such as Co, Fe and Ni are contained as main components, and a material such as B can be added to them appropriately. At the time of forming the first magnetization fixing layer 106 and the magnetization free layer 109 in addition to the second magnetization fixing layer 107, the substrate magnetic field forming device 30 is also used to magnetize in a prescribed direction. And, by using the rotation speed control method of the present invention, a film excelling in uniformity of the film thickness distribution or sheet resistance distribution can be formed.

As described above, the present inventors have considered that a phenomenon that the in-plane distribution of the film thickness or sheet resistance value of the obtained film is deviated is caused because the sputtering particles are subjected to a force in a certain direction by the influence of the electric field of the discharge plasma and the magnetic field M formed on the surface of the substrate 21. This tendency is considered that when a plasma density is increased by electric discharge with high electric power, the influences of the electric field of plasma and the magnetic field of magnet become more prominent. Accordingly, when the film formation is performed by generating the magnetic field M having directionality in one direction on the processing surface of the substrate 21 and rotating the substrate 21 about a rotary shaft perpendicular to the processing surface, the present invention controls the deviation of in-plane distribution when the film formation is performed by adjusting the rotation speed of the substrate 21 according to the rotation position of the substrate 21. According to the sputtering device 1 and the sputtering method of the present invention, the magnetic film excelling in uniformity of in-plane distribution can be formed when it is formed by oblique incidence sputtering with high electric power.

It is to be understood that modifications and variations of the embodiments can be made without departing from the spirit and scope of the invention.

Figure 9:
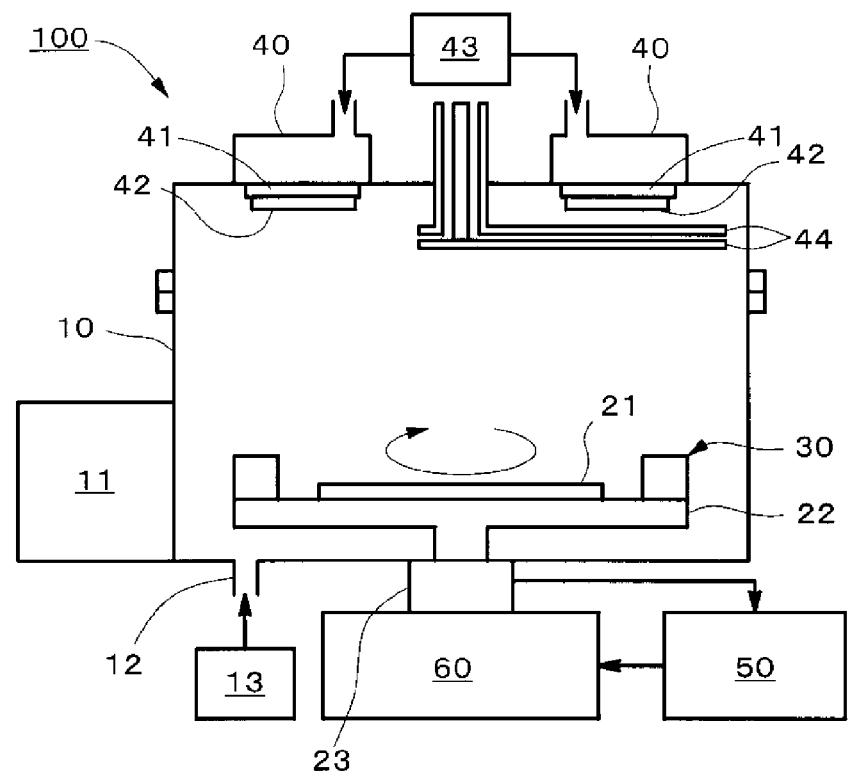
FIG. 9 is a schematic sectional view showing schematically a sputtering device according to another embodiment of the invention.

Fort example, in a sputtering device 100 shown in FIG. 9, the center of the substrate 21 (substrate holder 22) and the centers of the cathodes 41 (targets 42) are displaced in a horizontal direction, but the processing surface of the substrate 21 (surface of the substrate holder 22) and the surfaces of the cathodes 41 (surfaces of the targets 42) are positioned in parallel to each other. Thus, when the magnetic film is formed by the sputtering device 100 having the substrate 21 and the targets 42 arranged in parallel to each other the generation of a film thickness distribution or a sheet resistance distribution can be suppressed by controlling the rotation speed of the substrate 21 (substrate holder 22) as described above in connection with the control device 50.

Figure 10:
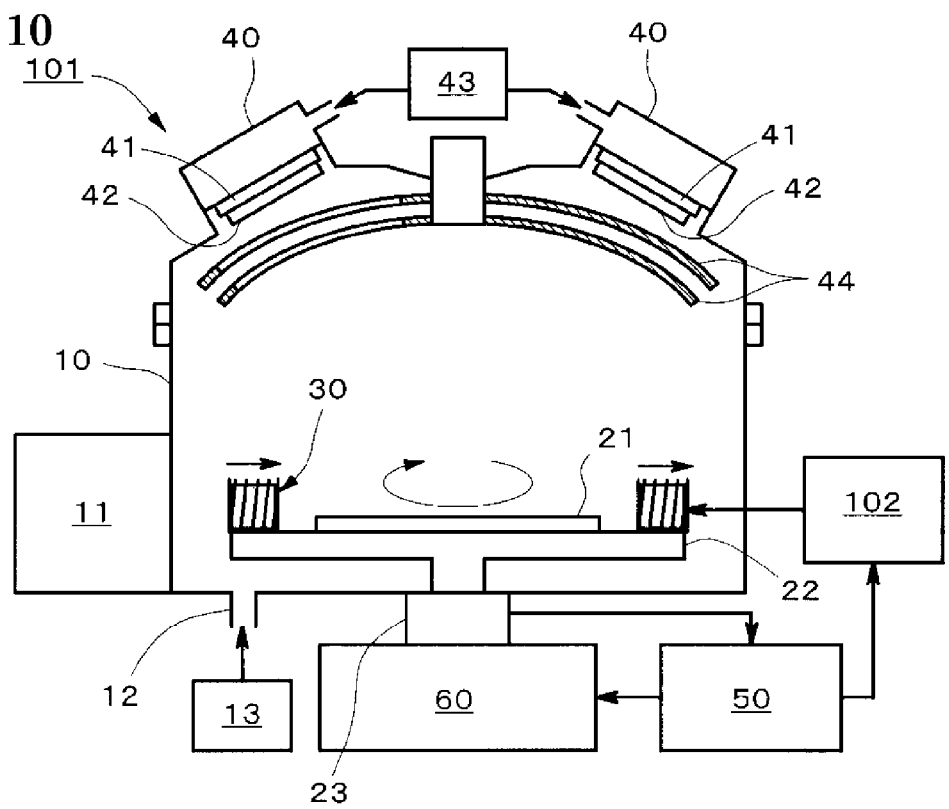
FIG. 10 is a schematic sectional view showing schematically a sputtering device according to still another embodiment of the invention.

The uniformity of the formed film can be improved by using electromagnets 30' instead of the magnet pieces 31 described with reference to FIG. 2 and controlling an electric current supplied to the electromagnets 30' according to the rotation position of the substrate 21 to adjust an intensity of the magnetic field generated on the processing surface of the substrate 21. For example, a sputtering device 101 shown in FIG. 10 is basically the same as the sputtering device 1 shown in FIG. 1 but different from the sputtering device 1 of FIG. 1 on the point that the control device 50 additionally controls the electric current supplied to the electromagnets 30'. In the drawing, 102 denotes a magnetic field forming power source for supplying a magnetic field forming electric current to the electromagnets 30'. And, the electromagnets 30' are electromagnet pieces arranged to generate the one-directional magnetic field M as described with reference to FIG. 2. Specifically, for example, the electromagnets 30' have electromagnet pieces which are disposed at least near the N-pole side center edge portion Nc and the S-pole side center edge portion Sc of the substrate to generate the one-directional magnetic field M described with reference to FIG. 2. It may be controlled to supply an electric current to the electromagnet pieces in an electrically connected state or to only one (e.g., near the N-pole side center edge portion Nc only) of them.

In the sputtering device 101 of this embodiment, the control device 50 controls the magnetic field forming power source 102 such that a first electric current having a minimum electric current value is supplied when the N-pole side center edge portion Nc shown in FIG. 2 which tends to have a large film thickness comes to the discharging cathode 41 side, and a second electric current having a maximum electric current value is supplied when the S-pole side center edge portion Sc shown in FIG. 2 which tends to have a small film thickness comes to the discharging cathode 41 side. It is preferable to increase or decrease the electric current value gradually between the first electric current and the second electric current, and it is most preferable to have the above-described sine wave control. The control of the electric current flowing to the electromagnets 30' configuring the substrate magnetic field forming device 30 may be performed together with or independent of the control of the rotation speed of the substrate 21 (substrate holder 22) described already in detail.

The present invention can be applied to not only the exemplified substrate processing device (magnetron sputtering device), but also to the plasma processing apparatus such as a dry etching apparatus, a plasma asher apparatus, a CVD apparatus and a liquid crystal display manufacturing device.

EXPLANATION OF REFERENCE NUMERALS

1: sputtering device, 100: sputtering device, 101: sputtering device, 10: chamber (reaction vessel), 11: exhaust pump, 12: gas inlet port, 13: reactive gas introducing system, 21: substrate, 22: substrate holder, 23: position detecting device, 30: substrate magnetic field forming device, 30': electromagnet, 31: magnet pieces, 40: cathode unit, 41: cathode, 42: target, 43: electric discharge gas introducing system, 44: shutter, 50: control device, 51: holder rotation control portion, 52: drive signal generation unit, 60: rotation drive mechanism, 61: holder rotation drive portion, 62: feedback control portion, Nc: N-pole side center edge portion, Sc: S-pole side center edge portion

What is claimed is:

1. A sputtering device comprising:
a substrate holder for holding a substrate rotatably about a rotary shaft perpendicular to a processing surface of the substrate;
a magnetic field forming device disposed around the substrate and rotatable together with or in synchronization with the substrate to form a magnetic field in one direction within the processing surface of the substrate;
cathodes disposed at positions to face obliquely the substrate and supplied with electric discharge power;
a position detecting device for detecting a rotation position of a magnetic pole of the magnetic field with respect to one of the cathodes which is discharging by the supply of the electric discharge power; and
a control device comprising a targeted speed calculation unit and a drive signal generation unit,
wherein the control device is programmed to adjust an electric current supplied to the magnetic field forming device such that a magnetism of the N-pole is decreased gradually as an N-pole side of the magnetic field forming device approaches the cathode generating an electric discharge and such that the magnetism of the N-pole is increased gradually as the S-pole side of the magnetic field forming device approaches the cathode generating the electric discharge, wherein the targeted speed calculation unit calculates a targeted rotation speed by using a correspondence relation between the rotation position and the targeted rotation speed, and wherein the drive signal generation unit generates a drive signal for producing the targeted rotation speed.

2. The sputtering device according to claim 1, wherein the control device calculates the targeted rotation speed as a sinusoidal function of a rotation angle of the substrate.

3. The sputtering device according to claim 1, wherein the control device adjusts the targeted rotation speed between a first speed when an N-pole side of the magnetic field comes close to a cathode during discharge and a second speed slower than the first speed when an S-pole side of the magnetic field comes close to the cathode during discharge.

4. The sputtering device according to claim 1, wherein the control device adjusts the targeted rotation speed between a first speed at a time when an intersection between a peripheral edge portion of the substrate at an N-pole side of the magnetic field and a linear line extended in parallel to the direction of the magnetic field and running through the center of the substrate comes close to a cathode and a second speed at a time when an intersection between a peripheral edge portion of the substrate at an S-pole side of the magnetic field and the linear line comes close to the cathode, where the second speed is slower than the first speed.

* * * * *